United States Patent [19]

Ito et al.

[11] Patent Number: 5,336,906
[45] Date of Patent: Aug. 9, 1994

[54] IMAGE SENSOR AND METHOD OF MANUFACTURE

[75] Inventors: Hisao Ito; Teiichi Suzuki, both of Kanagawa, Japan

[73] Assignee: Fuji Xerox Co., Ltd., Tokyo, Japan

[21] Appl. No.: 122,182

[22] Filed: Sep. 17, 1993

Related U.S. Application Data

[63] Continuation of Ser. No. 711,713, Jun. 7, 1991, abandoned, which is a continuation of Ser. No. 403,786, May 23, 1988, abandoned, which is a continuation of Ser. No. 46,450, May 6, 1987, abandoned.

[30] Foreign Application Priority Data

Sep. 9, 1986 [JP] Japan .................. 61-211897

[51] Int. Cl.$^5$ .................. H01L 31/04; H01L 27/14
[52] U.S. Cl. .................. 257/72; 257/53; 257/443; 257/446; 257/448
[58] Field of Search .................. 357/30; 257/72, 53, 257/443, 446, 448

[56] References Cited

U.S. PATENT DOCUMENTS

| 4,281,208 | 7/1981 | Kuwano et al. | 357/30 |
| 4,446,364 | 5/1984 | Hayashi et al. | 357/30 |
| 4,678,542 | 7/1987 | Boer et al. | 357/4 |
| 4,680,085 | 7/1987 | Vijan et al. | 357/4 |
| 4,754,152 | 6/1988 | Hayama et al. | 357/30 |

FOREIGN PATENT DOCUMENTS

| 57-211787 | 12/1982 | Japan | 357/2 |
| 58-201357 | 11/1983 | Japan | 357/30 |

*Primary Examiner*—Jerome Jackson
*Attorney, Agent, or Firm*—Finnegan, Henderson, Farabow, Garrett & Dunner

[57] ABSTRACT

An image sensor comprising a plurality of photo-electric conversion elements formed by layering a metal electrode, a photo-electric conversion layer, and a translucent electrode, the translucent electrode being divided into individual electrodes which are provided for the respective photo-electric conversion elements, and wherein at least the surfaces of the photo-electric conversion layer adjoining the translucent electrodes which appear between the individual electrodes are removed.

4 Claims, 3 Drawing Sheets

IMAGE SENSOR AND METHOD OF MANUFACTURE

This application is a continuation of application Ser. No. 07/711,713 filed Jun. 7, 1991, now abandoned, which is a continuation of application Ser. No. 07/403,786 filed May 23, 1988, now abandoned, which is a continuation of 07/046,450 filed May 6, 1987, now abandoned.

BACKGROUND OF THE INVENTION

This invention relates to image sensors, and more particularly to an image sensor comprising a plurality of photo-electric conversion elements having a "sandwich structure", and to a method of manufacturing such an image sensor.

Recently, a close contact type image sensor having a reading unit with a length equal to the width of an original document has been developed for use as a photo-electric converter in the image input section of a fascimile machine or the like. Use of such an image sensor eliminates the need for a reducing optical system, and the image sensor itself can be made small in size. As a result, a variety of close contact type image sensors are available in the art.

Conventional close contact type image sensors employ a line of photo-electric conversion elements, each having a so-called "sandwich structure" which is made up of (1) a metal electrode, (2), a translucent electrode and (3) a photo-electric conversion layer of amorphous silicon (a-Si:H) interposed between the two electrodes. In this type image sensor the translucent electrodes of the photo-electric conversion elements generally are common; that is, one common translucent electrode is used for all of the photo-electric conversion elements. This is for convenience in manufacture.

Such close contact type image sensors may be manufactured by laminating a metal electrode, an amorphous silicon layer, i.e., a photo-electric conversion layer, and an indium tin oxide (ITO) layer, i.e., a translucent electrode, all in the stated order, on a substrate. The upper layer, being affected by the lower layer, has less dimensional accuracy. Accordingly, it has been found desirable to use split metal electrodes for greater dimensional accuracy on the lower layer side, and to form the translucent electrodes on the upper layer side as a common electrode.

On the other hand, such an image sensor may be manufactured by laminating a translucent electrode, a photo-electric conversion layer, and a metal electrode, all in the stated order, on a substrate, and splitting the translucent electrode to achieve greater dimensional accuracy. However, in this case, it has not been possible to successfully laminate a transparent, electrically-conductive film, such as indium tin oxide (ITO), to form the translucent electrode and the photo-electric conversion layer. Accordingly, prior to the formation of the photo-electric conversion layer, the translucent electrode is shaped (or patterned) by photolithographic etching. However, the etching operation may form residues, which make the junction surface of the photo-electric conversion layer and the translucent electrode unsatisfactory and results in unsatisfactory characteristics. Accordingly, even in the above-described structure of the image sensor, one common translucent electrode is used for all of the photo-electric conversion elements.

In the foregoing "sandwich structure" photo-electric conversion elements, Schottky junctions are formed between the photoelectric conversion layers and the translucent electrodes. Therefore, in order for each of the photo-electric conversion elements to have a satisfactory diode characteristic, a bias voltage may be applied to the photo-electric conversion element in such a manner that the translucent electrode has a negative potential. Accordingly, in operation, a negative bias voltage is applied to the translucent electrode which is the common electrode for all of the photo-electric conversion elements of the image sensor.

However, a disadvantage of the above-described image sensor is that, when it is required to use it with other devices, the image sensor does not have the desired degree of freedom in circuit design. This is disadvantageous in forming the image sensor and other elements on one and the same substrate.

Therefore, there are various ways of forming an image sensor in which the metal electrode, the photo-electric conversion layer and the translucent electrode are piled on the substrate and wherein the translucent electrode is split into individual electrodes necessary for the respective photo-electric conversion elements. However, such an image sensor is still disadvantageous, in that the characteristics of the bits are not uniform, and the ratio of light current to dark current in each of the photo-electric conversion elements cannot be made sufficiently large. Thus, it is difficult to use such image sensors commercially.

OBJECTS AND SUMMARY OF THE INVENTION

Accordingly, an object of this invention is to eliminate the above-described difficulties encountered in conventional close contact type image sensors.

More specifically, an object of the invention is to provide a close contact type image sensor in which, when the image sensor is operated with a positive bias voltage applied to its common electrode, the characteristics of the photo-electric conversion elements are more uniform, and it possesses an excellent photoelectric conversion characteristic.

A further object is an improved method of manufacturing such a close contact type image sensor to produce photo-electric conversion elements that are uniform.

The foregoing objects and other objects of the present invention are achieved by a close contact type image sensor in which a plurality of photo-electric conversion elements are arranged adjacent each other in a line and are formed by layering a metal electrode, a photo-electric conversion layer and a translucent electrode on an insulating substrate, in that order; wherein the translucent electrode is divided into individual electrodes singly corresponding to the respective photo-electric conversion elements, and wherein between the individual electrodes thus provided, at least the exposed surface of the photo-electric conversion layer along the contours of the individual electrodes is removed. There is also provided a method of manufacturing an image sensor which, according to the invention, comprises the steps of forming a metal electrode; forming an amorphous silicon layer to provide a photo-electric conversion layer; forming a translucent electrically-conductive layer to provide a translucent electrode; and removing at least a part of each of the translucent electrically-conductive layer and the photo-electric conversion layer to provide a plurality of individual, photo-electric conversion elements.

BRIEF DESCRIPTION OF THE DRAWINGS

The nature, principle and utility of the present invention will become more apparent from the following detailed description when read in conjunction with the accompanying drawings, wherein.

DETAILED DESCRIPTION OF THE INVENTION

Experiments have indicated that, in the image sensor in which the translucent electrode is divided into individual electrodes for forming corresponding photo-electric conversion elements or bits, one of the possible causes of the bit characteristics being non-uniform is that the layer formed by diffusion of indium tin oxide, for instance, remains in place. Surprisingly, it has been found that the characteristics of the bits can be made more uniform by dividing the translucent electrode into individual electrodes for the respective bits as described above, and removing the surface of the photo-electric conversion layer between the individual electrodes. That is, that portion of the photo-electric conversion layer adjacent the junction with the translucent electrically conductive layer is removed, preferably by etching.

In the image sensor formed by patterning at least the surface of the photo-electric conversion layer as described above, the leakage current that otherwise may be caused by the diffraction of light can be eliminated, and the resolution of the image sensor can be improved.

Furthermore, in the image sensor, the dark current attributing to the lateral leakage of current can be greatly decreased, with the result that the ratio of light current to dark current is increased.

In the case where the translucent electrode and the photoelectric conversion layer are patterned by dry etching, it is desirable to additionally employ an annealing step. During the dry etching operation, the photo-electric conversion layer may be damaged and the junction characteristic may be deteriorated, thus adversely affecting the diode characteristic. The adverse effects can be removed by such annealing.

In the method of the present invention, the photo-electric conversion layer can be etched through the mask which has been used for patterning the translucent electrode. Thus, a close contact type image sensor having excellent characteristics and which can be operated with a positive bias voltage applied to the common electrode, can be readily provided.

Figure 1A:
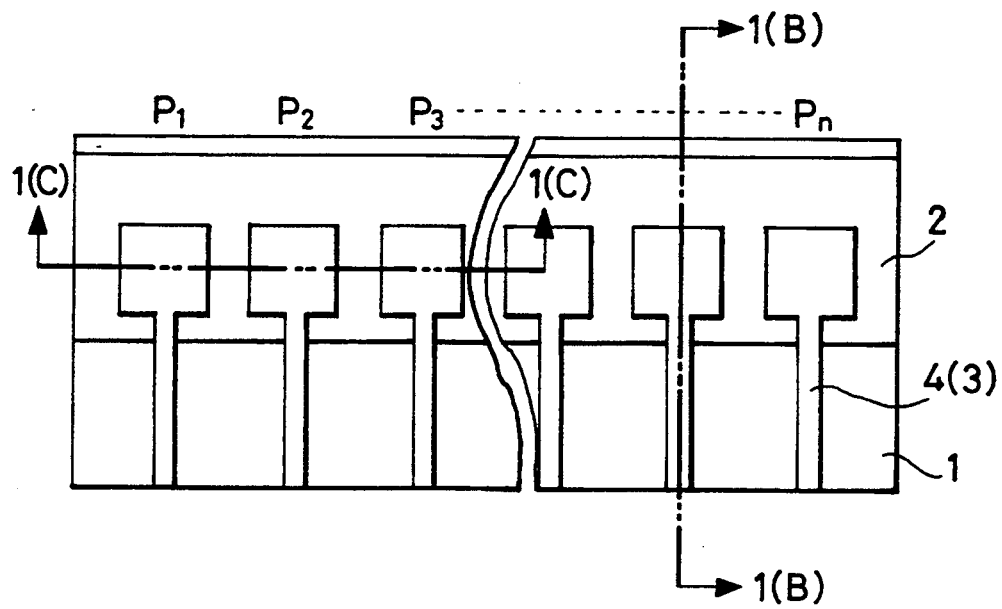
FIG. 1(A) is a plane view showing an example of a close contact type image sensor according to the present invention.
Figure 1B:
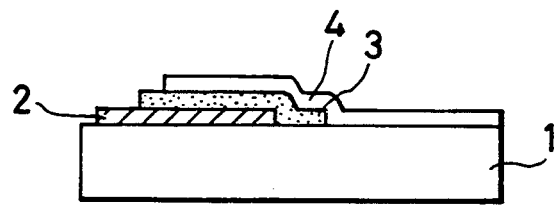
FIG. 1(B) is a sectional view taken along line 1(B)—1(B) in FIG. 1(A)
Figure 1C:
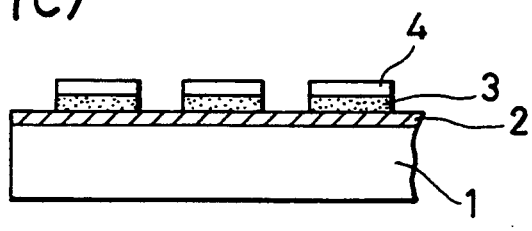
FIG. 1(C) is a sectional view taken along line 1(C)—1(C) in FIG. 1(A)

An embodiment of the close contact type image sensor of the present invention is shown in FIGS. 1(A), 1(B) and 1(C). An insulating substrate 1 is made of glass or similar material. An elongated metal electrode 2, is formed of a metal, preferably chromium, tungsten, tantalum or a nickel-chromium alloy such as Nichrome (80% Ni-20% Cr), on the glass substrate 1. One or more photo-electric conversion layers 3 of amorphous silicon hydride (a-Si:H) are formed on the metal electrode 2 and the glass substrate. One or more translucent electrode layers 4 of indium tin oxide, or tin dioxide, are formed on the photo-electric conversion layers 3. The metal electrode 2, the photo-electric conversion layers 3, and the indium tin oxide layers 4 are in ohmic contact and together form one or more photo-electric conversion elements $P_1$, $P_2$ ... and $P_n$ each having a so-called sandwich structure. These photo-electric conversion elements $P_1$ through $P_n$ are arranged in a line, or are positioned in an array with a density of, for example, 16 dots/m, to provide a light receiving section. The photo-electric conversion elements $P_1$ through $P_n$ are connected through a wiring section (not shown) to a drive circuit section (not shown).

A method of manufacturing the close contact type image sensor according to the invention is hereinafter described with reference to FIGS. 2(A) through 2(D).

Figure 2A:
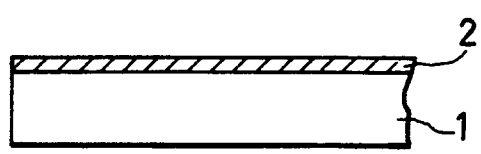
FIGS. 2(A), 2(B), 2(C) and 2(D) are sectional views depicting the steps of manufacturing the image sensor according to the present invention.

As shown in FIG. 2(A), a chromium layer 2 having a thickness of about 1000 Å, is formed on the glass plate 1 by sputtering according to a well-known technique. The chromium layer 2 is shaped in the form of a belt, thus providing an elongated metal electrode 2 that is used as a common electrode by the photo-electric conversion elements.

Figure 2C:
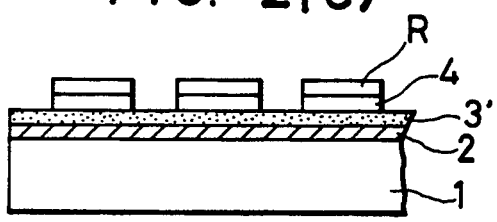
Figure 2B:
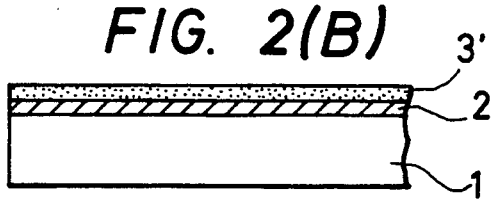

Thereafter, as shown in FIG. 2(B), an amorphous silicon hydride layer 3' having a thickness of about 1 μm, is formed on the metal electrode by the well-known plasma CVD method. In the formation of the layer 3', silane gas ($SiH_4$) is used at a flow rate of 20 to 50 SCCM under a pressure of 0.2 to 0.5 Torr. The substrate is held at a temperature of 150° C. to 250° C., and an RF power of 20 to 50 mW/cm$^2$ is applied for 30 to 60 minutes.

Next, as shown in FIG. 2(C), an indium tin oxide layer 4 having a thickness of about 800 Å, is formed on the amorphous silicon hydride layer 3' by the well-known DC magnetron sputtering method, od. Then, a photoresist layer R is formed on the indium tin oxide layer 4. Thereafter, these two layers are subjected to photolithoetching, to remove at least a part of each to form separate, individual translucent electrodes 4.

Figure 2D:
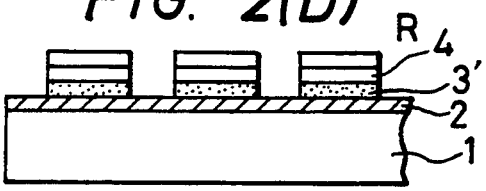

With the photoresist layer R as a mask, the amorphous silicon hydride layer 3' is etched with a mixture of tetrafluoromethane gas ($CF_4$) and oxygen gas ($O_2$), to form the separate photo-electric conversion layers 3 as shown in FIG. 2(D).

Thereafter, the photoresist layer R is removed. The device thus formed is annealed in the air at a temperature of 200° C. for thirty minutes. Thus, the close contact type image sensor, as shown in FIGS. 1(A) through 1(C), is formed.

Figure 3:
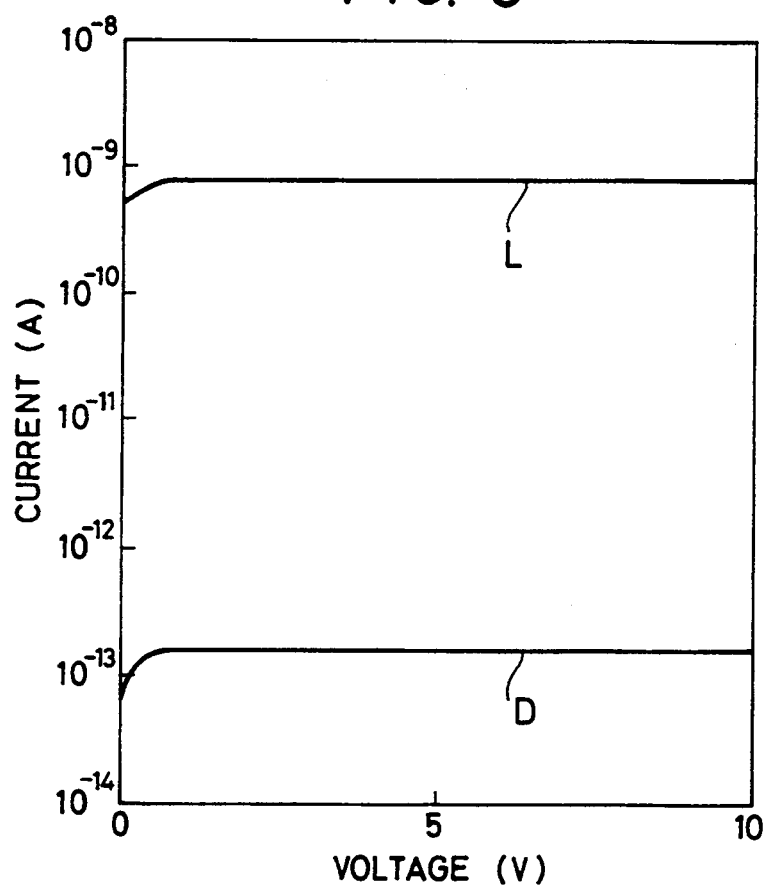
FIG. 3 is a graphical representation indicating the current (I) - voltage (V) characteristic of the close contact type image sensor according to the present invention.

FIG. 3 shows the current (I) - voltage (V) characteristic of the photo-electric conversion elements of the close contact type image sensor thus formed. The characteristic has been obtained by measuring the light current (L) and the dark current (D) of an image sensor 100 μm×100 μm in area under a green light source of 100 IX. As is apparent from FIG. 3, in the close contact type image sensor, the light current is about $10^{-9}$A when saturated with a quantum efficiency of 1, whereas the dark current is about $10^{-13}$A. That is, the light current differs from the dark current by a factor of about $10^4$. This indicates that the image sensor of the invention has an excellent photo-electric conversion characteristic. Furthermore, the image sensor of the invention can be operated with positive bias voltage applied to the metal electrode which is the common electrode for the photo-electric conversion elements. This increases the degree of freedom in designing a device with the image sensor.

The photo-electric conversion elements of the image sensor hand considerably stable characteristics, and therefore, the outputs of the bits are uniform and scarcely fluctuate. That is, the photo-electric conversion elements have uniform output characteristics.

It is believed that the excellent characteristics of the image sensor of the invention is due to several factors. In the close type image sensor of the invention, the photo-electric conversion layers 3 are made substantially identical in configuration to the translucent electrodes 4 by annealing, and the photoelectric conversion layers, which may have been deteriorated by dry etching, are treated to join the corresponding translucent electrodes. Accordingly, barriers are formed to suppress the injection of electrons from the translucent electrodes into the photo-electric conversion elements.

Figure 4A:
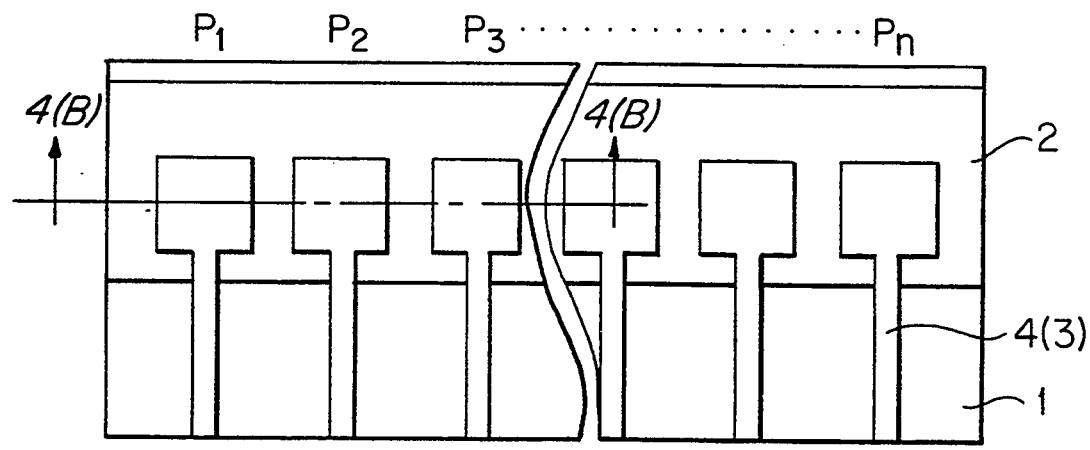
FIG. 4(A) is a plane view showing another example of a close contact type image sensor according to the present invention.
Figure 4B:
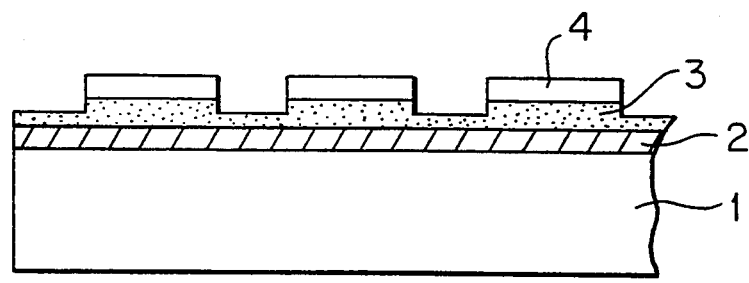
FIG. 4(B) is a sectional view taken along line 4(B)—4(B) in FIG. 4(A).

In the above-described embodiment, the photo-electric conversion layer is etched completely between the translucent electrodes; however, in another embodiment only the surface of the photo-electric conversion layer is removed along the contours of the electrodes. For example, the junction with the translucent electrodes may be slightly etched, as shown in FIGS. 4(A) and 4(B). The annealing treatment is very effective in improving and stabilizing the characteristics of the image sensor; however, the annealing treatment may be omitted if desired. The materials for forming the insulating substrate electrode, the photoelectric conversion layers and the translucent electrodes are not limited to those which have been described above, and alternative materials will be apparent to those skilled in the art.

In summary, there has been described above an improved image sensor in which the photo-electric conversion elements each having a so-called "sandwich structure" consisting of the metal electrode, the translucent electrode, and the photo-electric conversion layer disposed between these electrodes are arranged on the substrate. The translucent electrode is divided into the individual electrodes, which are provided for the conversion elements, respectively, and at least the surface of the photoelectric conversion layer is removed between the individual electrodes. Therefore, the image sensor of the present invention can be operated with positive bias voltage applied to the metal electrode which is the common electrode for the photo-electric conversion elements. Furthermore, in the image sensor of the invention, the output characteristics of the bits are uniform, and the ratio of light current to dark current is high, for the same reason.

We claim:

1. A close type high resolution image sensor comprising:
    an insulating substrate;
    an elongated metal electrode formed on said substrate;
    an amorphous silicon hydride photo-electric conversion layer formed on said metal electrode and made of a single film;
    a plurality of individual, spaced-apart translucent electrodes made of indium tin oxide and formed on first portions of said photo-electric conversion layer, so as to provide a plurality of individual, spaced-apart photo-electric conversion elements;
    wherein said metal electrode serves as a common electrode for said individual, spaced-apart photo-electric conversion elements; and
    wherein said photo-electric conversion layer includes second portions not covered by said translucent electrodes and having a thickness less than the thickness of said first portions of said photo-electric conversion layer.

2. An image sensor as claimed in claim 1, in which said metal electrode is a metal selected from the group consisting of chromium tungsten, tantalum, and nickel-chromium alloy.

3. An image sensor as claimed in claim 1, wherein said second portions of said photo-electric conversion layer are located adjacent to said translucent electrodes.

4. An image sensor as claimed in claim 1, wherein said second portions of said photo-electric conversion layer having a thickness less than the thickness of said first portions of said photo-electric conversion layer are formed by etching said photo-electric conversion layer.

* * * * *